United States Patent
Saito

(10) Patent No.: US 7,422,947 B2
(45) Date of Patent: Sep. 9, 2008

(54) SEMICONDUCTOR DEVICE AND METHOD OF MANUFACTURING THE SAME

(75) Inventor: Tomohiro Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 220 days.

(21) Appl. No.: 11/519,891

(22) Filed: Sep. 13, 2006

(65) Prior Publication Data

US 2007/0007594 A1 Jan. 11, 2007

Related U.S. Application Data

(62) Division of application No. 10/902,296, filed on Jul. 30, 2004, now Pat. No. 7,166,895.

(30) Foreign Application Priority Data

May 19, 2004 (JP) ............................. 2004-148727

(51) Int. Cl.
*H01L 21/336* (2006.01)
*H01L 21/84* (2006.01)

(52) U.S. Cl. ................... 438/283; 438/149; 438/151; 438/197; 257/E21.454; 257/E21.642

(58) Field of Classification Search .......... 257/E21.454, 257/E21.642
See application file for complete search history.

(56) References Cited

U.S. PATENT DOCUMENTS 6,583,469 B1 6/2003 Fried et al.

(Continued)

FOREIGN PATENT DOCUMENTS

JP 8-181323 7/1996

(Continued)

OTHER PUBLICATIONS

Notification of Reason for Rejection issued by the Japanese Patent Office on Sep. 1, 2006, for Japanese Patent Application No. 2004-148727, and English-language translation thereof.

*Primary Examiner*—Scott B. Geyer
*Assistant Examiner*—Mohsen Ahmadi
(74) *Attorney, Agent, or Firm*—Finnegan, Henderson, Farabow, Garrett & Dunner, L.L.P.

(57) ABSTRACT

A semiconductor device manufacturing method comprises depositing a semiconductor layer and mask material in order over a semiconductor substrate on an insulating film; patterning the semiconductor layer and mask material to form a semiconductor layer in a predetermined region; removing a surface portion of the insulating film by a predetermined depth by performing etching by using the mask material as a mask; forming gate insulating films on at least a pair of opposing side surfaces of the semiconductor layer; depositing silicon on the insulating film, gate insulating films, and mask material; patterning the silicon into a gate pattern to form, on the gate insulating films, a silicon film having the gate pattern on predetermined regions of the pair of opposing side surfaces of the semiconductor layer; ion-implanting a predetermined impurity into the semiconductor layer by using the silicon film as a mask, thereby forming a source region and drain region in two end portions of the semiconductor layer where the silicon film is not formed; and forming a metal film by depositing a metal on at least the silicon film, and forming a gate electrode by reacting the silicon film with the metal film.

10 Claims, 8 Drawing Sheets

U.S. PATENT DOCUMENTS

| | | |
|---|---|---|
| 6,770,516 B2 | 8/2004 | Wu et al. |
| 6,962,843 B2 | 11/2005 | Anderson et al. |
| 7,385,237 B2 * | 6/2008 | Lee et al. .................... 257/288 |

FOREIGN PATENT DOCUMENTS

| | | |
|---|---|---|
| JP | 2001-298194 | 10/2001 |
| JP | 2002-110963 | 4/2002 |
| JP | 2002-118255 | 4/2002 |
| WO | WO 2004/019414 A1 | 3/2004 |

* cited by examiner

SEMICONDUCTOR DEVICE AND METHOD OF MANUFACTURING THE SAME

This is a division of application Ser. No. 10/902,296, filed Jul. 30, 2004 now U.S. Pat. No. 7,166,895, which is incorporated herein by reference.

CROSS REFERENCE TO RELATED APPLICATION

This application is based upon and claims benefit of priority under 35 USC §119 from the Japanese Patent Application No. 2004-148727, filed on May 19, 2004, the entire contents of which are incorporated herein by reference.

RELATED ART

The present invention relates to a semiconductor device and a method of manufacturing the same.

Conventionally, a method of forming a vertical double gate structure, i.e., a so-called fin structure, as the gate structure of a transistor has been developed as a method of improving the drivability of a semiconductor. By using this method as the gate structure, it is possible to improve the dominating power of the gate electrode, and increase the driving current. This fin-type MOSFET (Metal Oxide Semiconductor Field Effect Transistor) will be referred to as a FinFET hereinafter.

In this FinFET, a semiconductor layer having a convex portion is formed over a semiconductor substrate on a buried insulating film. On certain portions of a pair of side surfaces and the upper surface of this semiconductor layer, a U-shaped gate electrode is formed over the semiconductor layer.

In the FinFET, a channel region is also formed in that region of the semiconductor layer, which is surrounded by the gate electrode, and source and drain regions are formed in the semiconductor layer on the two sides of the channel region so as to sandwich the channel region.

The FinFET is a fully depleted element in which the channel region is fully depleted. Accordingly, if normal polysilicon is used as the gate electrode material, the gate threshold voltage lowers, and this makes the gate threshold voltage difficult to adjust. In the FinFET, therefore, the gate threshold voltage is optimized by increasing it by using a metal as the gate electrode material.

As the gate electrode using a metal as the gate electrode material, a suicide metal gate electrode formed by completely reacting polysilicon with a metal, i.e., a full silicide gate electrode, is proposed.

A method of forming a full silicide gate electrode in the FinFET will be explained below. First, an SOI (Silicon On Insulator) substrate is prepared by stacking a buried insulating film and semiconductor layer in this order on a semiconductor substrate, and the semiconductor layer is patterned into a convex structure.

After a gate insulating film is formed, polysilicon as the base material of a full suicide gate electrode is deposited on the entire surface, and patterned into a gate pattern. After that, a metal such as nickel (Ni) is deposited and reacted with the polysilicon to form a full silicide gate electrode.

In this full silicide gate electrode formation method, when polysilicon as the base material and nickel react with each other, the supply amount of nickel reduces near the lower corners of the gate electrode. Since this makes complete silicidation impossible, polysilicon which has not reacted with nickel may remain near these lower corners.

In the thus formed full silicide gate electrode, polysilicon which has not reacted with nickel is present near the channel region formed in the semiconductor layer. This unreacted polysilicon varies the gate threshold voltage, and adversely affects the transistor operation of the FinFET.

The reference related to the FinFET using a silicide as the gate electrode is as follows.

Japanese Patent Laid-Open No. 2002-118255

SUMARY OF THE INVENTION

According to one aspect of the present invention, there is provided a method of manufacturing a semiconductor device, comprising:

depositing a semiconductor layer and mask material in order over a semiconductor substrate on an insulating film;

patterning the semiconductor layer and mask material to form a semiconductor layer in a predetermined region;

removing a surface portion of the insulating film by a predetermined depth by performing etching by using the mask material as a mask;

forming gate insulating films on at least a pair of opposing side surfaces of the semiconductor layer;

depositing silicon on the insulating film, gate insulating films, and mask material;

patterning the silicon into a gate pattern to form, on the gate insulating films, a silicon film having the gate pattern on predetermined regions of the pair of opposing side surfaces of the semiconductor layer;

ion-implanting a predetermined impurity into the semiconductor layer by using the silicon film as a mask, thereby forming a source region and drain region in two end portions of the semiconductor layer where the silicon film is not formed; and forming a metal film by depositing a metal on at least the silicon film, and forming a gate electrode by reacting the silicon film with the metal film.

According to one aspect of the present invention, there is provided a semiconductor device comprising:

an insulating film formed on a semiconductor substrate and having a convex;

a semiconductor layer formed on the convex of said insulating film;

a gate electrode formed, via gate insulating films, on predetermined regions of a pair of opposing side surfaces of said semiconductor layer, and containing silicon and a metal; and a source region and drain region formed in two end portions of said semiconductor layer where said gate electrode is not formed.

DETAILED DESCRIPTION OF THE INVENTION

Figure 1:
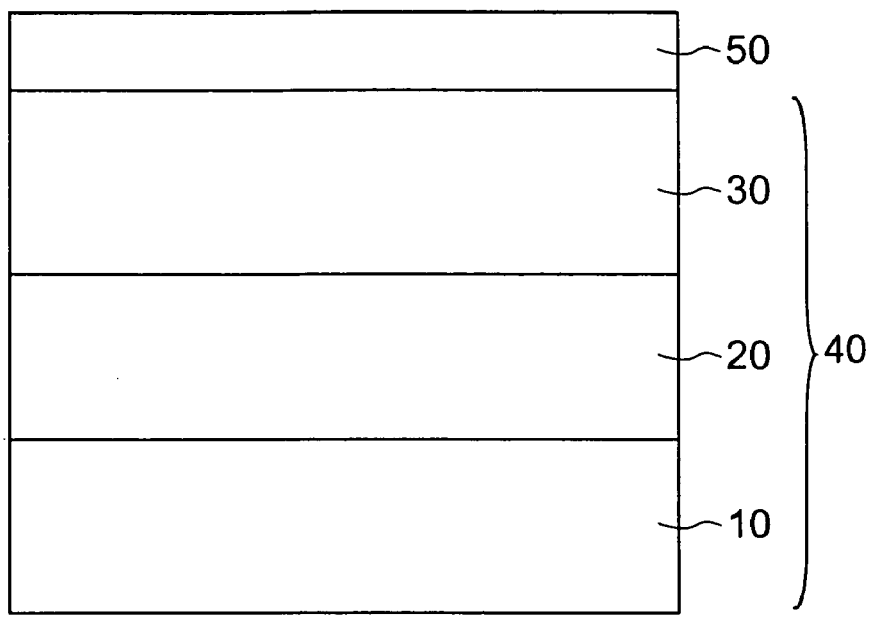
FIG. 1 is a side view of an element in a certain step of a FinFET manufacturing method according to an embodiment of the present invention.

An embodiment of the present invention will be described below with reference to the accompanying drawings.

FIGS. 1 to 13 illustrate a FinFET manufacturing method according to the embodiment of the present invention. Of FIGS. 1 to 13, FIGS. 1, 3, 5, 8, 10, and 12 are side views of an element in different steps, when viewed in a direction A of FIG. 7, and FIGS. 2, 4, 6, 9, 11, and 13 are longitudinal sectional views of the element in different steps, taken along a line B-B in FIG. 7.

First, an SOI (Silicon On Insulator) substrate 40 is prepared by stacking a buried insulating film 20 and semiconductor layer 30 in this order on a semiconductor substrate 10. Note that the semiconductor substrate 10 and semiconductor layer 30 are made of, e.g., single-crystal silicon.

A mask material 50 made of, e.g., a silicon nitride film (SiN) is then deposited on the SOI substrate 40 by CVD (Chemical Vapor Deposition) or the like. Note that the mask material 50 is not limited to a silicon nitride film (SiN), but may also be another insulating film such as a silicon oxide film.

Figure 2:
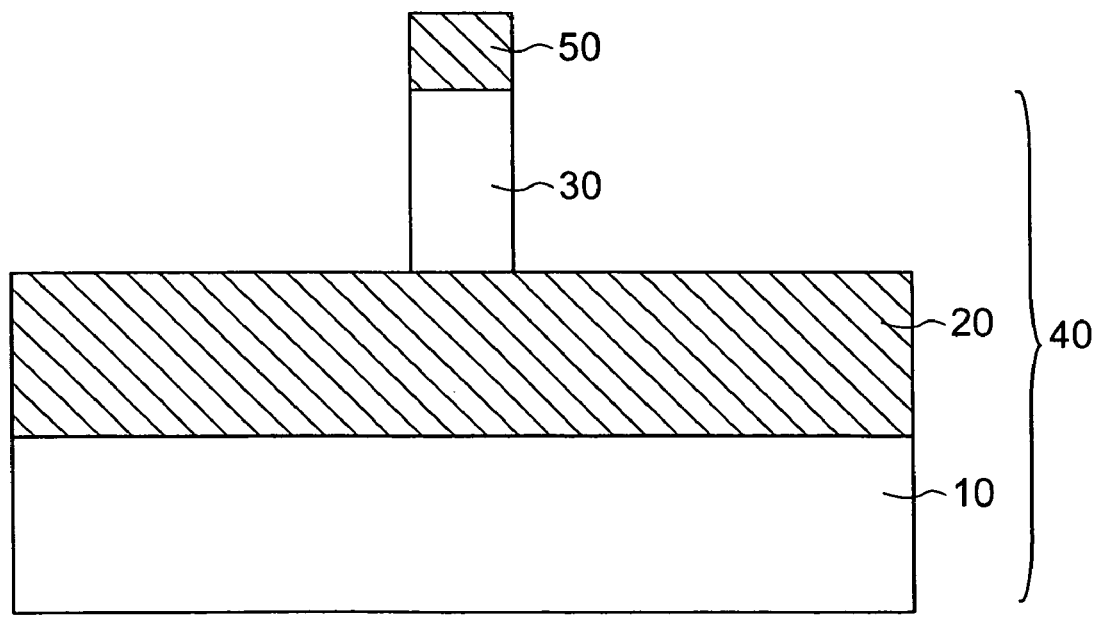
FIG. 2 is a longitudinal sectional view showing the sectional structure of the element in the same step of the FinFET manufacturing method.

As shown in FIGS. 1 and 2, lithography and anisotropic etching such as RIE (Reactive Ion Etching) are performed to sequentially pattern the mask material 50 and semiconductor layer 30, thereby forming a semiconductor layer 30 and mask material 50 on the buried insulating film 20.

Figure 3:
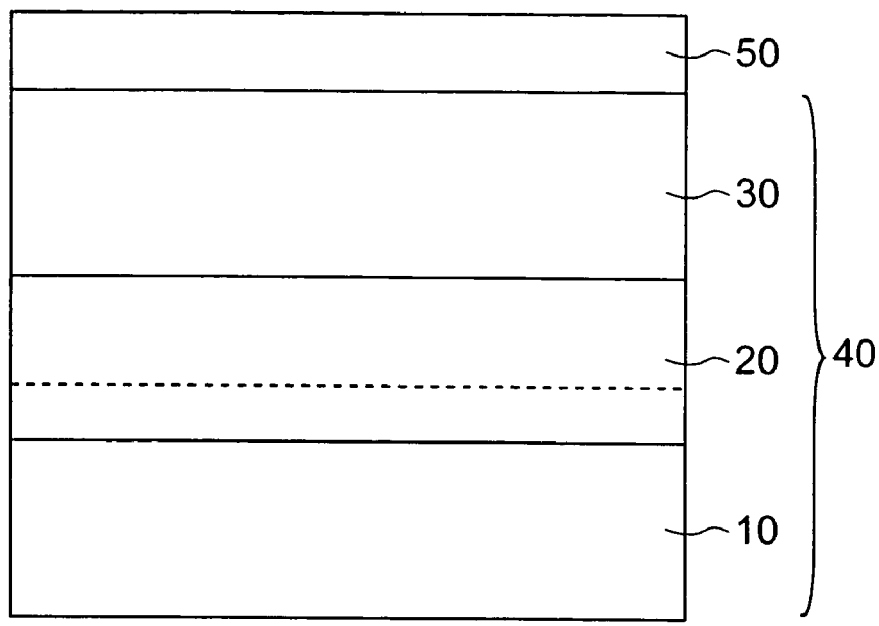
FIG. 3 is a side view of the element in a certain step of the FinFET manufacturing method.
Figure 4:
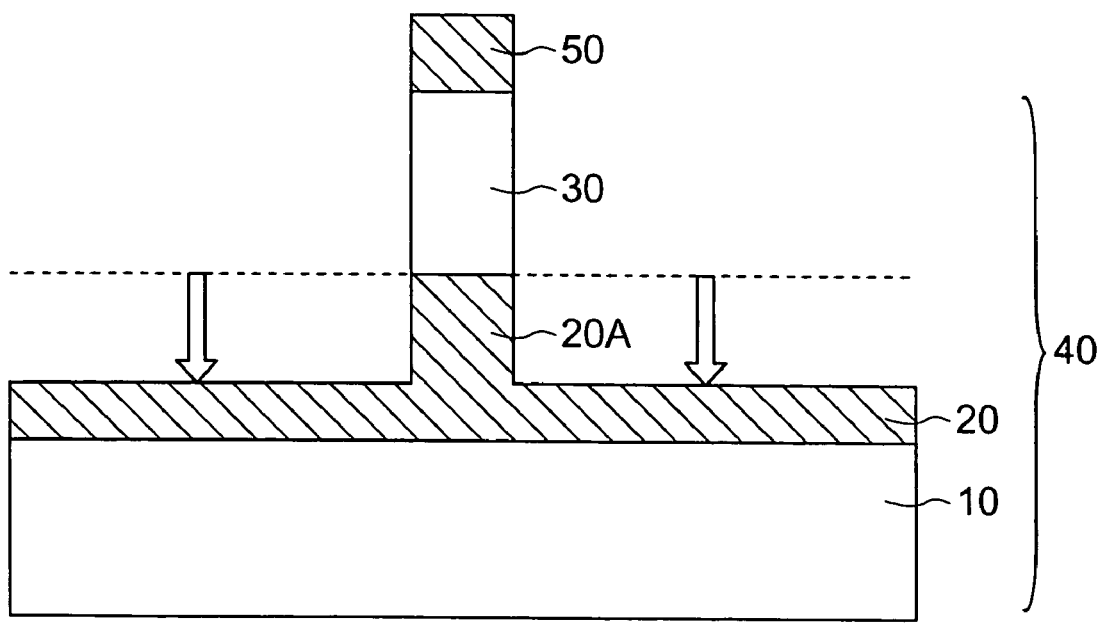
FIG. 4 is a longitudinal sectional view showing the sectional structure of the element in the same step of the FinFET manufacturing method.

As shown in FIGS. 3 and 4, the buried insulating film 20 is kept anisotropically etched to a depth of about 100 nm to form a convex 20A. To make the crystal growth directions of a polysilicon film (to be formed later) uniform on a gate insulating film, it is desirable to anisotropically etch away an amount equal to or larger than the film thickness of this polysilicon film (to be formed later). However, it is not always necessary to anisotropically etch away an amount equal to or larger than the film thickness of the polysilicon film.

When the buried insulating film 20 is etched in the direction of depth, the buried insulating film 20 positioned around the bottom of the semiconductor layer 30 may also be slightly etched in the lateral direction to make the width of the convex 20A formed on the buried insulating film 20 smaller than that of the semiconductor layer 30.

Figure 5:
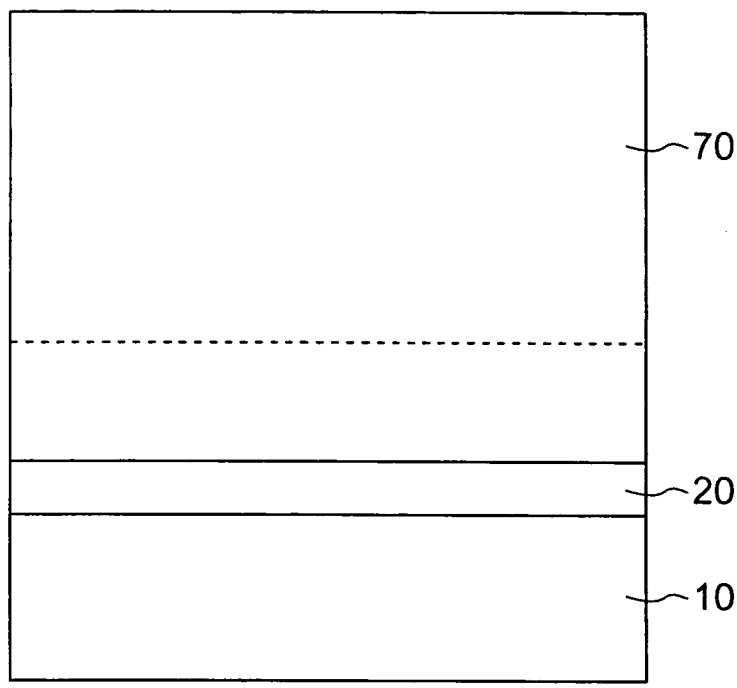
FIG. 5 is a side view of the element in a certain step of the FinFET manufacturing method.
Figure 6:
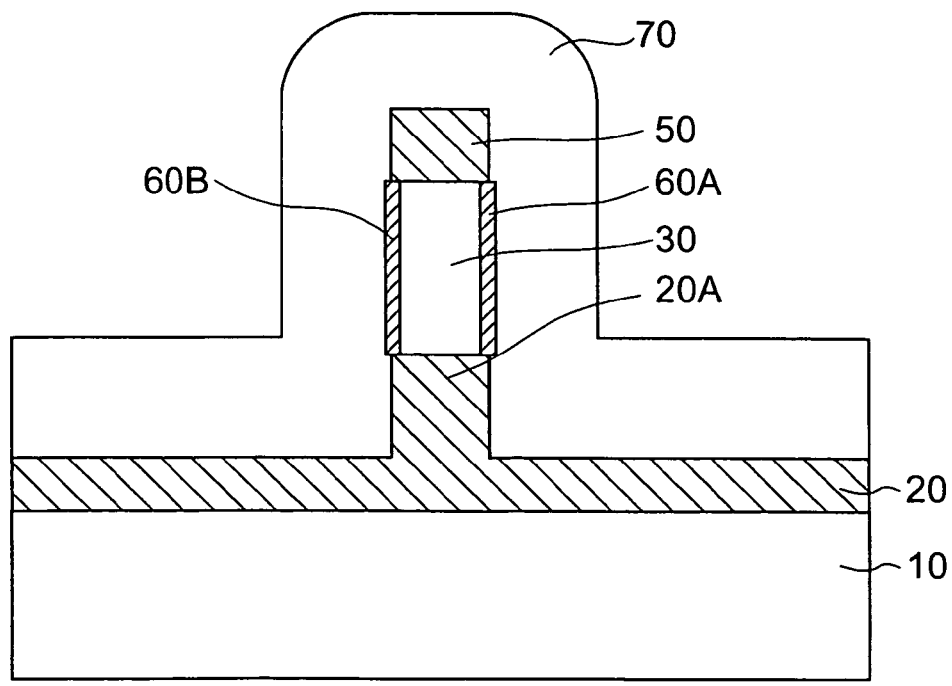
FIG. 6 is a longitudinal sectional view showing the sectional structure of the element in the same step of the FinFET manufacturing method.

As shown in FIGS. 5 and 6, gate insulating films 60A and 60B respectively having desired film thicknesses are entirely formed on a pair of opposing side surfaces of the semiconductor layer 30. In this step, the gate insulating films 60A and 60B can be formed by oxidizing the surfaces of the semiconductor layer 30, or by depositing high dielectric films such as hafnium silicate films on all the surfaces of the semiconductor layer 30. Furthermore, the gate insulating films 60A and 60B are not limited to oxide films or hafnium silicate films, but may also be various other high dielectric films, or oxide films or oxynitride films of these high dielectric films.

Note that gate insulating films may also be formed on the two side surfaces and upper surface of the semiconductor layer 30, after the mask material 50 is removed. In this case, the upper surface of the semiconductor layer 30 also serves as a channel.

A polysilicon film 70 is formed on the entire surface by depositing polysilicon about 100 nm thick as the base material of a full silicide gate electrode by CVD or the like. In this step, amorphous silicon may also be deposited instead of polysilicon, and germanium may also be contained.

Figure 7:
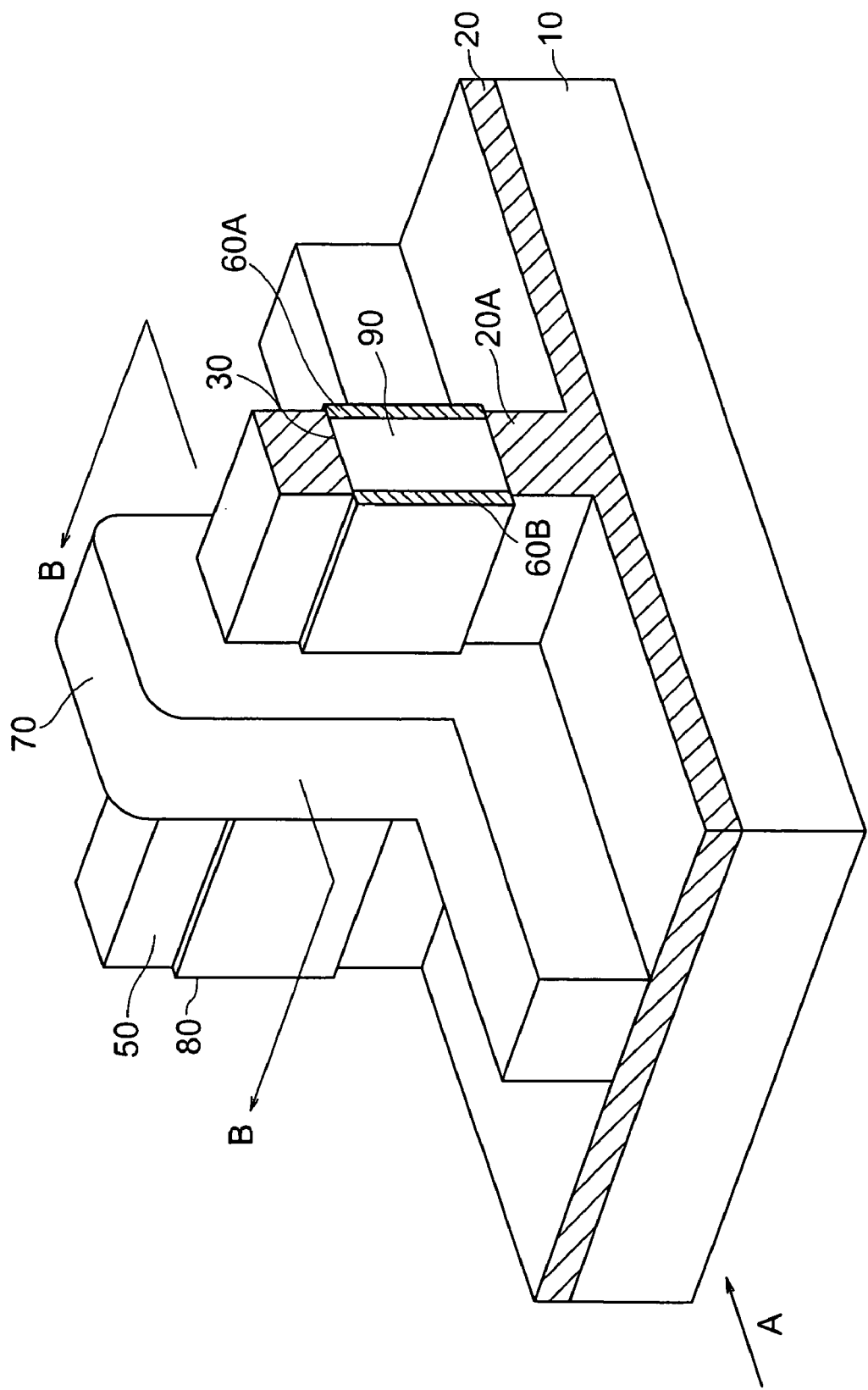
FIG. 7 is a perspective view of the element in a certain step of the FinFET manufacturing method.
Figure 8:
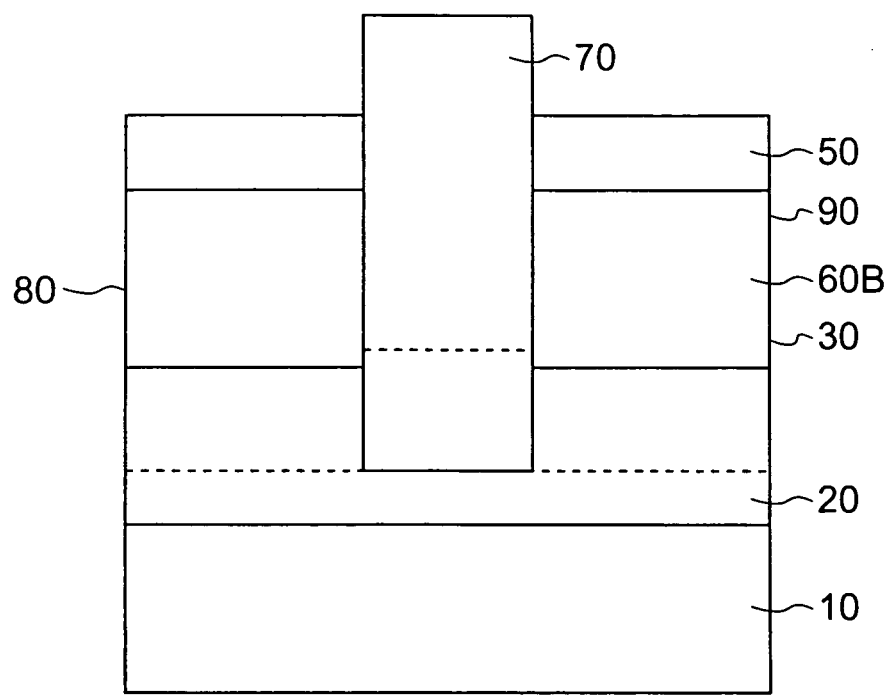
FIG. 8 is a side view of the element in a certain step of the FinFET manufacturing method.
Figure 9:
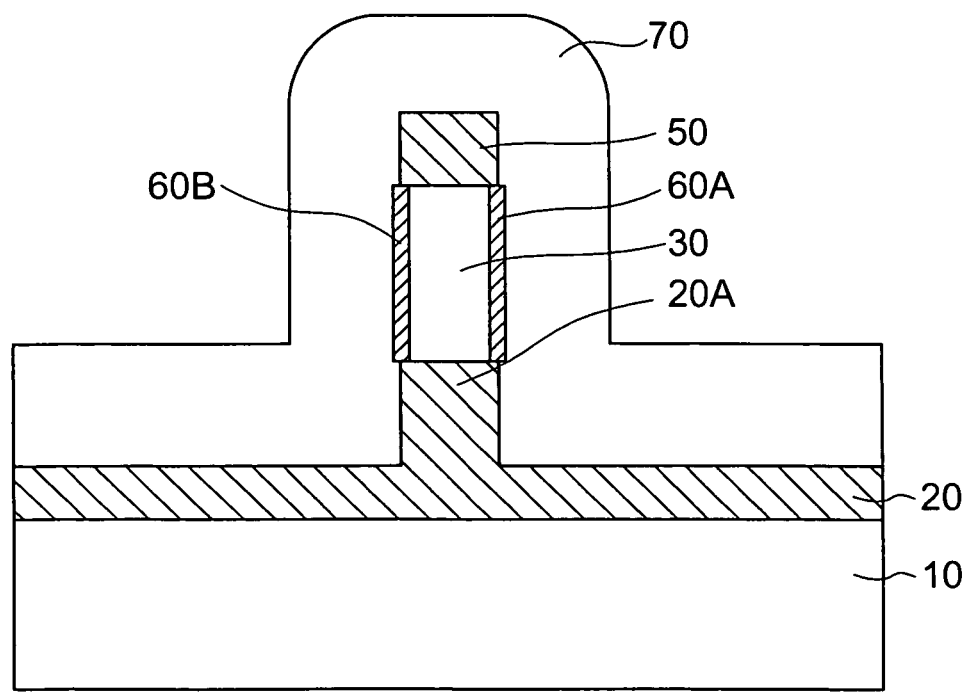
FIG. 9 is a longitudinal sectional view showing the sectional structure of the element in the same step of the FinFET manufacturing method.

As shown in FIGS. 7, 8, and 9, lithography and RIE are performed to pattern the polysilicon film 70 into a gate pattern. FIG. 8 is a side view viewed in the direction A in FIG. 7. FIG. 9 is a longitudinal sectional view taken along the line B-B in FIG. 7. Since the deposited polysilicon film 70 is uneven, it is sometimes difficult to pattern the polysilicon film 70 into a gate pattern. If this is the case, after polysilicon is deposited, the deposited polysilicon film may also be planarized by depositing an insulating film such as a nitride film, before being patterned into a gate pattern.

By using the polysilicon film 70 patterned into a gate pattern as a mask, a predetermined impurity is ion-implanted into those two end portions of the semiconductor layer 30, which are not covered with the polysilicon film 70. Annealing is then performed to form a source region 80 and drain region 90. Note that a sidewall insulating film may also be formed on the side surfaces of the polysilicon film 70 and semiconductor layer 30 before this ion implantation is performed.

Figure 10:
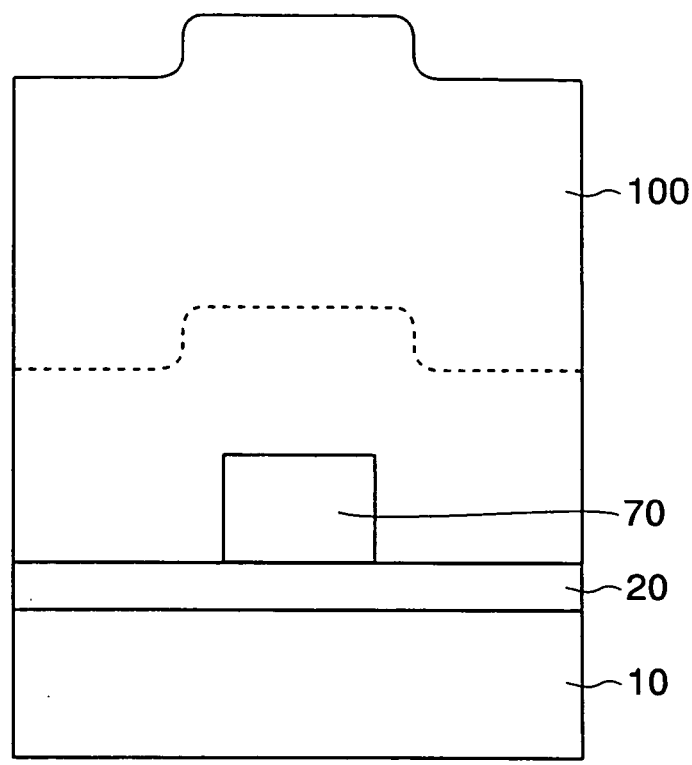
FIG. 10 is a side view of the element in a certain step of the FinFET manufacturing method.
Figure 11:
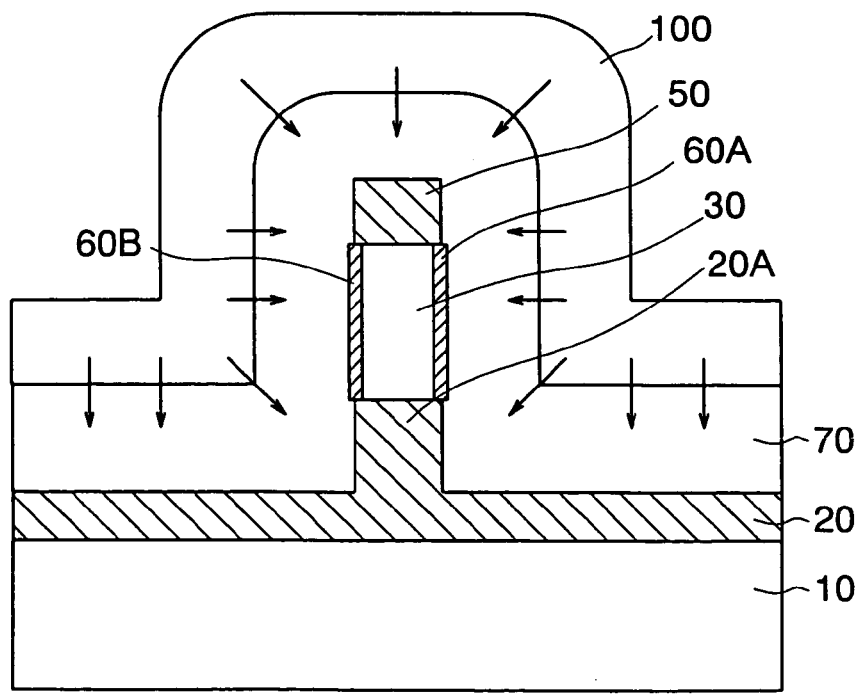
FIG. 11 is a longitudinal sectional view showing the sectional structure of the element in the same step of the FinFET manufacturing method.

After the polysilicon film 70 undergoes a surface treatment such as cleaning as needed, as shown in FIGS. 10 and 11, a nickel film 100 about 100 nm thick is formed as a silicide material on the entire surface. Note that the silicide material is not limited to nickel, and it is also possible to use at least one of various metals such as cobalt, titanium, tungsten, erbium, yttrium and platinum. Note also that the nickel film 100 need not be formed on the entire surface, but may also be formed on at least the polysilicon film 70.

The polysilicon film 70 and nickel film 100 are reacted with each other by annealing at about 450° C., thereby forming nickel silicide. This annealing step need not be performed at once, but may also be separately performed a plurality of number of times.

Figure 12:
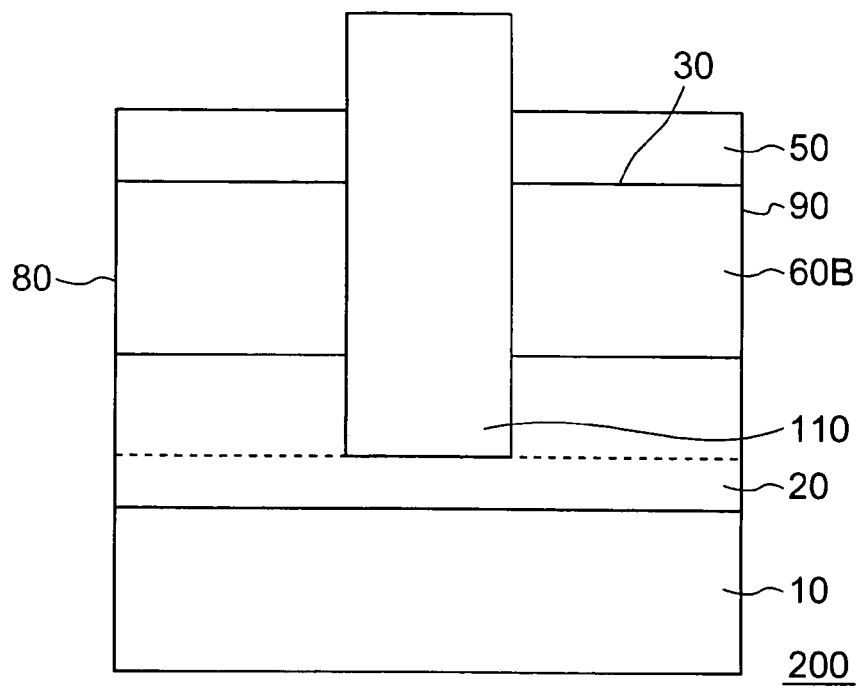
FIG. 12 is a side view of the element in a certain step of the FinFET manufacturing method.
Figure 13:
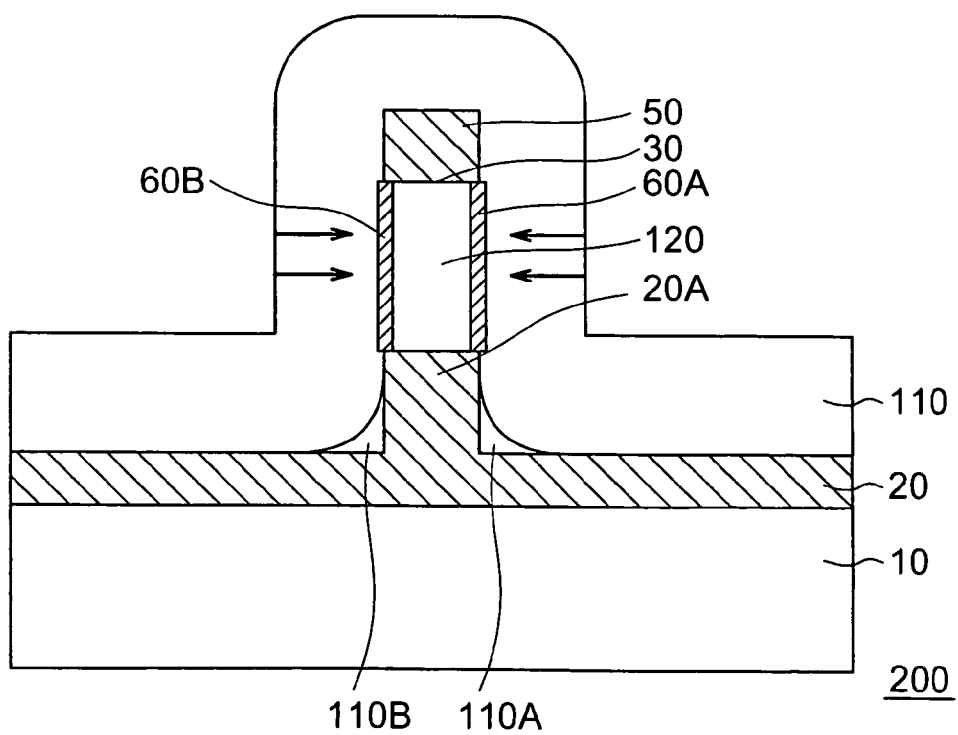
FIG. 13 is a longitudinal sectional view showing the sectional structure of the element in the same step of the FinFET manufacturing method.

As shown in FIGS. 12 and 13, unreacted nickel sticking to the surface of the nickel silicide is removed by an aqueous sulfuric peroxide solution to form a nickel silicide gate electrode, i.e., a full silicide gate electrode 110, thereby manufacturing a FinFET 200.

In the FinFET 200 fabricated by the above method, as shown in FIGS. 12 and 13, the buried insulating film 20 having a convex shape is formed on the surface of the semiconductor substrate 10, and the semiconductor layer 30 and mask material 50 are formed on the convex portion 20A of the buried insulating film 20.

A channel region 120 is formed at a predetermined portion of the semiconductor layer 30. In the semiconductor layer 30, the source region 80 and drain region 90 are formed on the two sides of the channel region 120 so as to sandwich the channel region 120.

Of the side surfaces of the semiconductor layer 30, the gate insulating films 60A and 60B are formed on at least a pair of opposing side surfaces. The U-shaped full silicide gate electrode 110 is formed on predetermined regions of the two side surfaces of the semiconductor layer 30 on the gate insulating films 60A and 60B, and formed on the upper surface of the semiconductor layer 30 on the mask material 50, so as to extend over the semiconductor layer 30.

Figure 14:
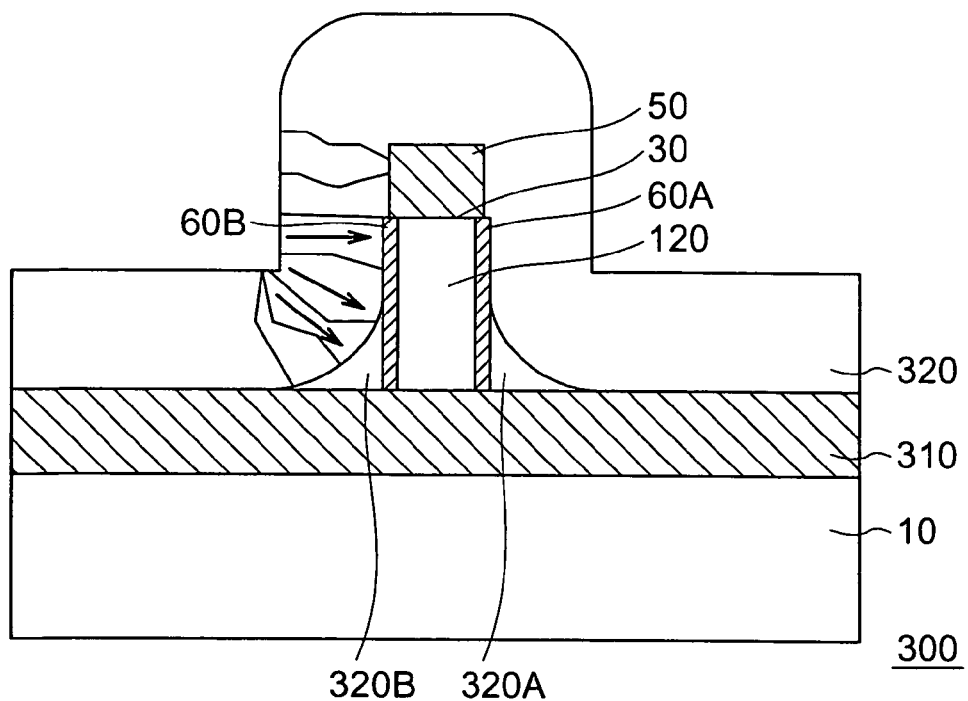
FIG. 14 is a longitudinal sectional view showing the sectional structure of a FinFET as a comparative example.
Figure 15:
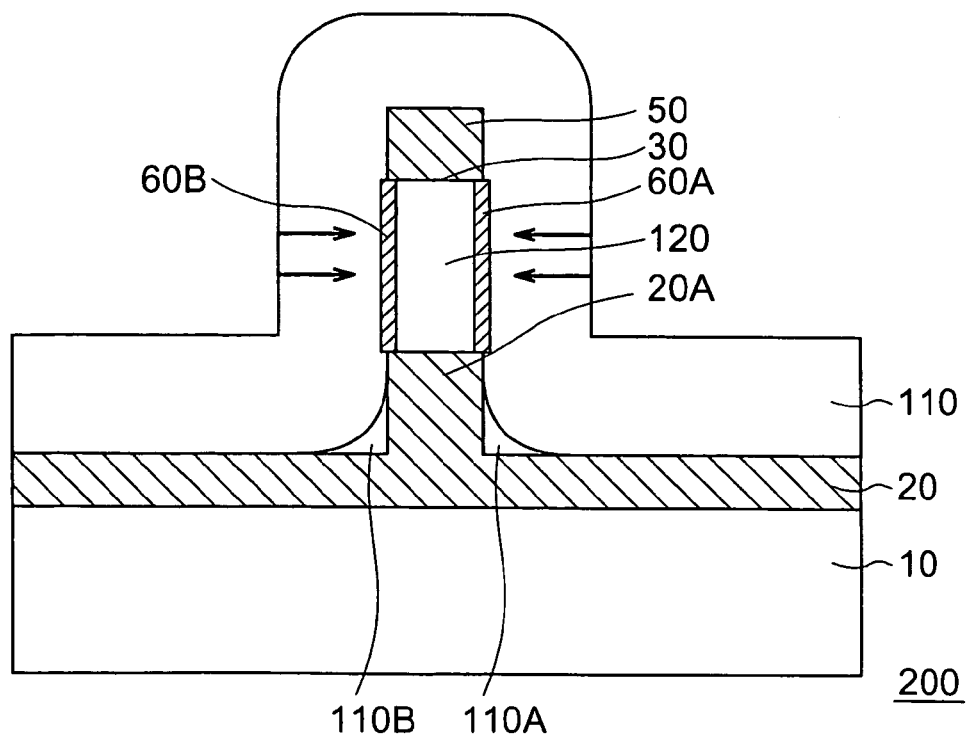
FIG. 15 is a longitudinal sectional view showing the sectional structure of the FinFET according to the embodiment of the present invention.

FIG. 14 shows the structure of a FinFET 300, as a comparative example, which is fabricated without anisotropically etching a buried insulating film 310 when the semiconductor layer 30 is anisotropically etched. FIG. 15 shows the structure of the FinFET 200 according to this embodiment.

As shown in FIG. 14, when a polysilicon film and nickel film are reacted with each other in the FinFET 300 of the comparative example, if unreacted polysilicon remains in portions 320A and 320B near the lower corners of a full silicide gate electrode 320, this unreacted polysilicon has an adverse effect on the transistor operation of the FinFET 300 because the unreacted polysilicon is positioned near the channel region 120 of the semiconductor layer 30.

In this embodiment as shown in FIG. 15, however, even if unreacted polysilicon remains in portions 110A and 110B near the lower corners of the full silicide gate electrode 110 when the full silicide gate electrode 110 is formed by reacting the polysilicon film 70 with the nickel film 100, this unreacted polysilicon is positioned near the convex 20A of the buried insulating film 20. Therefore, the unreacted polysilicon has no influence on the transistor operation of the FinFET 200.

Also, in the FinFET 300 of the comparative example as shown in FIG. 14, the film thickness of the polysilicon film changes near the channel region 120 of the semiconductor layer 30. This changes the nickel supply amount from one position to another. Consequently, the nickel composition cannot be uniform near the channel region 120 of the semiconductor layer 30.

By contrast, in this embodiment as shown in FIG. 15, the film thickness of the polysilicon film 70 near the channel region 120 of the semiconductor layer 30 is uniform. This makes the nickel supply amount uniform near the channel region 120. Accordingly, that portion of the full suicide gate electrode 110, which is positioned near the channel region 120 of the semiconductor layer 30 and which essentially serves as the gate electrode of a transistor can have a uniform composition.

Furthermore, in the FinFET 300 of the comparative example as shown in FIG. 14, the crystal growth of polysilicon progresses in different directions (directions indicated by the arrows in FIG. 14) near the lower corners of the full silicide gate electrode 320 positioned near the channel region 120 of the semiconductor layer 30. Therefore, the crystal alignment when silicidation is performed is not uniform.

In this embodiment as shown in FIG. 15, however, near the channel region 120 of the semiconductor layer 30 the crystal growth directions (directions indicated by the arrows in FIG. 15) of the polysilicon film 70 as the base material are more uniform than in the FinFET 300. This makes the crystal alignment more uniform than in the FinFET 300 when silicidation is performed.

Note that in the steps shown in FIGS. 3 and 4, if the buried insulating film 20 is anisotropically etched by an amount equal to or larger than the film thickness of the polysilicon film 70, the crystal growth directions of the polysilicon film 70 near the channel region 120 (the gate insulating films 60A and 60B) can be made uniform. So, the crystal alignment can be made uniform when silicidation is performed.

Since this makes the work function of the gate electrode constant, it is possible to improve the sub-threshold characteristics (switching characteristics), and improve the yield of semiconductor integrated circuits by suppressing variations in transistor characteristics.

Note that the above embodiment is merely an example, and hence does not limit the present invention. For example, the U-shaped full silicide gate electrode 110 need not be formed on the two side surfaces and upper surface of the semiconductor layer 30 so as to extend over the semiconductor layer 30. That is, a full silicide gate electrode may also be formed only on the two side surfaces of the semiconductor layer 30, without being formed on the upper surface of the semiconductor layer 30.

The invention claimed is:

1. A method of manufacturing a semiconductor device, comprising:
   depositing a semiconductor layer and mask material in order over a semiconductor substrate on an insulating film;
   patterning the semiconductor layer and mask material to form a semiconductor layer in a predetermined region;
   removing a surface portion of the insulating film by a predetermined depth by performing etching by using the mask material as a mask;
   forming gate insulating films on at least a pair of opposing side surfaces of the semiconductor layer;
   depositing silicon on the insulating film, gate insulating films, and mask material;
   patterning the silicon into a gate pattern to form, on the gate insulating films, a silicon film having the gate pattern on predetermined regions of the pair of opposing side surfaces of the semiconductor layer;
   ion-implanting a predetermined impurity into the semiconductor layer by using the silicon film as a mask, thereby forming a source region and drain region in two end portions of the semiconductor layer where the silicon film is not formed; and
   forming a metal film by depositing a metal on at least the silicon film, and forming a gate electrode by reacting the silicon film with the metal film.

2. A method according to claim 1, wherein when the insulating film is etched, the predetermined depth is substantially the same as or not less than a film thickness of the silicon film.

3. A method according to claim 1, wherein the silicon film is formed, the silicon is patterned into the gate pattern to form the silicon film having a U-shaped gate pattern over the semiconductor layer, such that the silicon film is formed on predetermined portions of the pair of opposing side surfaces of the semiconductor layer on the gate insulating films, and on the predetermined portion of an upper surface of the semiconductor layer on the mask material.

4. A method according to claim 1, wherein when the silicon film is formed, the silicon is patterned into the gate pattern to form the silicon film having a U-shaped gate pattern over the semiconductor layer, such that the silicon film is formed on predetermined portions of the pair of opposing side surfaces and an upper surface of the semiconductor layer on the gate insulating films.

5. A method according to claim 1, wherein when the gate electrode is formed, the metal film is formed by depositing, as the metal, at least one material selected from the group consisting of nickel, tungsten, platinum, cobalt, erbium, yttrium and titanium, on at least the silicon film, and the gate electrode is formed by reacting the silicon film with the metal film.

6. A method according to claim 1, wherein when the gate electrode is formed, the metal film is formed by depositing the metal on the silicon film, insulating film, gate insulating films, and mask material, and the gate electrode is formed by reacting the silicon film with the metal film.

7. A method according to claim 1, wherein when the insulating film is etched, the insulating film is etched such that a width of a convex formed of the insulating film is substantially the same as or smaller than a width of the semiconductor layer.

8. A method according to claim 2, wherein when the insulating film is etched, the insulating film is patterned such that a width of a convex formed of the insulating film is substantially the same as or smaller than a width of the semiconductor layer.

9. A method according to claim 3, wherein when the insulating film is etched, the insulating film is patterned such that a width of a convex formed of the insulating film is substantially the same as or smaller than a width of the semiconductor layer.

10. A method according to claim 4, wherein when the insulating film is etched, the insulating film is patterned such that a width of a convex formed of the insulating film is substantially the same as or smaller than a width of the semiconductor layer.

* * * * *